(12) United States Patent  
Minami

(10) Patent No.: US 6,969,580 B2  
(45) Date of Patent: Nov. 29, 2005

(54) METHOD OF MANUFACTURING SEMICONDUCTOR DEVICE

(75) Inventor: Takayoshi Minami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 109 days.

(21) Appl. No.: 10/418,042

(22) Filed: Apr. 18, 2003

(65) Prior Publication Data

US 2003/0198878 A1 Oct. 23, 2003

(30) Foreign Application Priority Data

Apr. 23, 2002 (JP) ............................ 2002-120991

(51) Int. Cl.⁷ .............................................. G03F 7/26
(52) U.S. Cl. ........................ 430/313; 430/396; 216/41
(58) Field of Search ............................... 430/313–316, 430/5, 394, 396; 438/585; 216/41, 72

(56) References Cited

U.S. PATENT DOCUMENTS 5,446,521 A * 8/1995 Hainsey et al. ............... 355/53
6,174,818 B1 * 1/2001 Tao et al. ...................... 438/733
2002/0160590 A1 * 10/2002 Hashimoto et al. .......... 438/528

FOREIGN PATENT DOCUMENTS

JP 2000-227652 8/2000

* cited by examiner

Primary Examiner—Kathleen Duda
(74) Attorney, Agent, or Firm—Westerman, Hattori, Daniels & Adrian, LLP

(57) ABSTRACT

A resist pattern of a resist film is formed by exposing the resist film using a gate electrode forming mask (a Levenson phase shift mask), and developing the resist film. An antireflection film is etched using the resist pattern as an etching mask, and the resist pattern and the antireflection film are trimmed. The manner of this trimming is not to etch a hard mask made of an inorganic material, but to etch the resist pattern and the antireflection film made of an organic material. Since a region consistent with a wiring pattern of the hard mask is covered by the resist pattern completely, breaking down and retraction of the wiring are prevented.

32 Claims, 21 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2002-120991, filed on Apr. 23, 2002, the entire contents of which are incorporated herein by reference.

BACKGROUND OF THE INVENTION

1. Field of the Invention

The present invention relates to a method of manufacturing a semiconductor device including a step of patterning one layer using a plurality of reticles.

2. Description of the Related Art

With recent miniaturization of semiconductor devices, formation of miniaturized wirings and miniaturized pitches are required. Consequently, a multiple exposure process using a plurality of reticles (exposure masks) is introduced for patterning of one layer.

The multiple exposure process comprises the steps of, first, forming a layer to be patterned on or above a semiconductor substrate to form a resist film thereon by coating. Then, a first sheet of the reticle is aligned to transfer a pattern of the reticle on the resist film. Subsequently, a second sheet of the reticle is aligned to transfer a pattern of the reticle on the same resist film.

Then, a surface inspection, a pattern size inspection and inspection of reticle alignment are carried out. In the pattern size inspection, whether each reticle pattern is transferred on the resist film under suitable exposure conditions and focus conditions is ascertained. Also in the reticle alignment inspection, the amount of misalignment between patterns on the lower layer and/or on the same layer is measured so that alignment of all reticles to have been used is confirmed to be within a predetermined value.

Besides, a phase edge technology which is one of the multiple exposure process is currently attracting a great deal of attention. Mainly two sheets of reticles are used in the phase edge technology. One is a Levenson phase shift mask and the other is a binary mask or a half tone phase shift mask and the like. The Levenson phase shift mask is processed in a manner that the phase of transmission light is shifted by π (180°) sandwiching a region to form gate electrodes. A pattern in which only the gate electrodes are narrowed can be formed by using these two sheets of reticles. The order of the exposure step in the phase edge technology is the same as that of the multiple exposure process described above. It should be noted that since design data for the Levenson phase shift mask used in the phase edge technology is designed to dispose a shifter pattern only on a portion to be a gate electrode, it is prepared based on the layout of the other sheet of reticles.

On the other hand, in the phase edge technology, since the shifter pattern is required to be designed based on a design data for an original gate electrode, in other words, a design data for the other reticle (exposure mask), it is a matter of course that regions capable of disposing shifters are required to exist on both sides of the original gate electrode. This is because when size of the shifter pattern is not equal to or more than a predetermined value, the contrast is lowered so that effect of the phase shift cannot be sufficiently obtained. However, due to recent rapid miniaturization of the device, it becomes difficult to secure a region of sufficient width.

Especially, a portion having a great influence due to being incapable of securing the region for the shifter pattern is wiring formed in the same layer as the layer having the gate electrode therein. Since width between the gate electrode and the wiring is narrowed as the miniaturization advances, when shifter patterns with a sufficient width are intended to secure on both sides of the gate electrode pattern in the reticle, a width between the shifter pattern and the wiring pattern becomes remarkably narrow, and sometimes they are adjacent to each other.

Accordingly, when to exposure using this shifter pattern, a result of subsequent development shows that the wiring pattern transferred on a resist film sometimes retracts further more than the design data. Further when two gate electrodes are disposed sandwiching wiring therebetween, the wiring may break down sometimes. Therefore, it is quite difficult to use a shifter pattern having enough width.

Hence, a method of manufacturing a semiconductor device which can solve the above-described disadvantage is disclosed in Japanese Patent Application Laid-open No. 2000-227652. In the method disclosed in this publication, first, a hard mask is formed on a layer to be patterned. Then, a first resist film is formed on the hard mask. Next, a pattern of a first reticle is transferred on the first resist film. After that, the hard mask is etched using the first resist film as a mask. Thereafter, a second resist film is formed on this hard mask to transfer a pattern of a second reticle on the second resist film. Subsequently, the hard mask is etched again using the second resist film as a mask. Then, patterning of a layer to be patterned is carried out using this hard mask. According to this method, it is possible to avoid breaking down of wired portion.

However, as the recent miniaturization of patterns and pitches advances, it sometimes happens that a pattern with a desired size cannot be formed when the phase edge technology is used alone. In such a case, a trimming technology has been sometimes used together with the phase edge technology, but it still has a disadvantage that width of the wiring becomes narrower than the design value due to adoption of the trimming technology. Incidentally, the trimming technology is a technology to make an organic resin film such as a resist film and the like narrower by etching.

In general, wiring is required to be low in resistance. This requirement is necessary to avoid disadvantages in such that propagation velocity of a signal is reduced when the resistance is high. Therefore, a method of reducing the resistance by changing the wiring surface into silicide with Co, Ti, or the like is adopted. However, even when the resistance of the wiring is reduced by such a method, it becomes impossible to obtain the predetermined characteristics if the wiring gets narrower than the design value, especially when the wiring is long. As a result, even when the operational speed of a transistor is increased through shortening of the gate length, performance of the semiconductor device cannot be improved sufficiently because of deterioration of the performance caused by the wiring. Such a disadvantage has not been solved even with the method disclosed in the above-described publication.

Though it is possible to avoid merely lowering of the propagation speed of the signal by simply making the wiring pattern intentionally broader at the step of designing, it is quite difficult in a semiconductor device in which miniaturization of pitches is going on to design only the wiring broader than a predetermined value in advance. In other words, when forming a resist pattern, since only the wiring pattern gets broader without changing the pitches thereof, the width between the patterns gets much narrower. As a result, adjacent patterns transferred on the resist film may connect to each other. Besides, broadening of the wiring is against the requirement of miniaturization of pitches.

As described above, conventionally, formation of a fine gate electrode using the phase edge technology together with the trimming technology has been extremely difficult.

SUMMARY OF THE INVENTION

The present invention has been made in view of the above disadvantage, and aims at providing a method of manufacturing a semiconductor device in which gate length can be shortened while avoiding narrowing of the width of wirings.

The present inventor has attained to aspects of the invention shown below as a result of earnest studies.

A method of manufacturing a semiconductor device relating to the present invention is a method to produce a semiconductor device in which a first region and a second region having a width narrower than that of the first region exist in a film. The method of manufacturing a semiconductor device comprises: a step of forming a hard mask on the film to be processed; a step of forming a first resist film on the hard mask; a step of processing the first resist film into a shape at least to define by covering a first portion in the film to be processed and to cover a portion including a second portion in the film to be processed; a step of etching the hard mask using the first resist film as a mask; a step of removing the first resist film; a step of forming a second resist film on the whole surface; a step of processing the second resist film into a shape at least to cover a portion wider than the contour of the first portion in the film to be processed and to cover a portion wider than the contour of the second portion in the film to be processed; a step of processing the second resist film into a shape at least to cover a portion including the first portion in the film to be processed and to define by covering the second portion in the film to be processed, by trimming the second resist film; a step of etching the hard mask using the second resist film as a mask; and a step of etching the film to be processed using the hard mask as a mask, thereby forming the first region in the first portion and the second region in the second portion.

In the present invention, a region which is consistent with the first region of the hard mask is covered with the second resist film completely before and after trimming of the second resist film to form the second region having a desired size. Consequently, breaking down and retraction of the second region to be a wiring, for instance, are prevented by etching the film to be processed using a hard mask patterned with the second resist film as an etching mask.

Another method of manufacturing a semiconductor device relating to the present invention is, similar to the above-described invention, a method to produce a semiconductor device in which a first region and a second region having a width narrower than that of the first region exist in a film. This another method of manufacturing a semiconductor device comprises: a step of forming a hard mask on the film to be processed; a step of forming a first resist film on the hard mask; a step of processing the first resist film into a shape at least to cover a portion wider than the contour of a first portion in the film to be processed and to cover a portion wider than the contour of a second portion in the film to be processed; a step of processing the first resist film into a shape at least to cover a portion including the first portion in the film to be processed and to define by covering the second portion in the film to be processed, by trimming the first resist film; a step of etching the hard mask using the first resist film as a mask; a step of removing the first resist film; a step of forming a second resist film on the whole surface; a step of processing the second resist film into a shape at least to define by covering the first portion in the film to be processed and to cover a portion including the second portion in the film to be processed; a step of etching the hard mask using the second resist film as a mask; and a step of etching the film to be processed using the hard mask as a mask, thereby forming the first region in the first portion and the second region in the second portion.

In the present invention, a region which is consistent with the first region of the hard mask is covered with the first resist film completely before and after trimming of the first resist film to form the second region having a desired size. Besides, since fluctuation of the film thickness of the first resist film to be used for patterning of the second region is hard to occur, the width of the first region is not likely to fluctuate on the same substrate.

DETAILED DESCRIPTION OF THE PREFERRED EMBODIMENTS

Figure 1A:
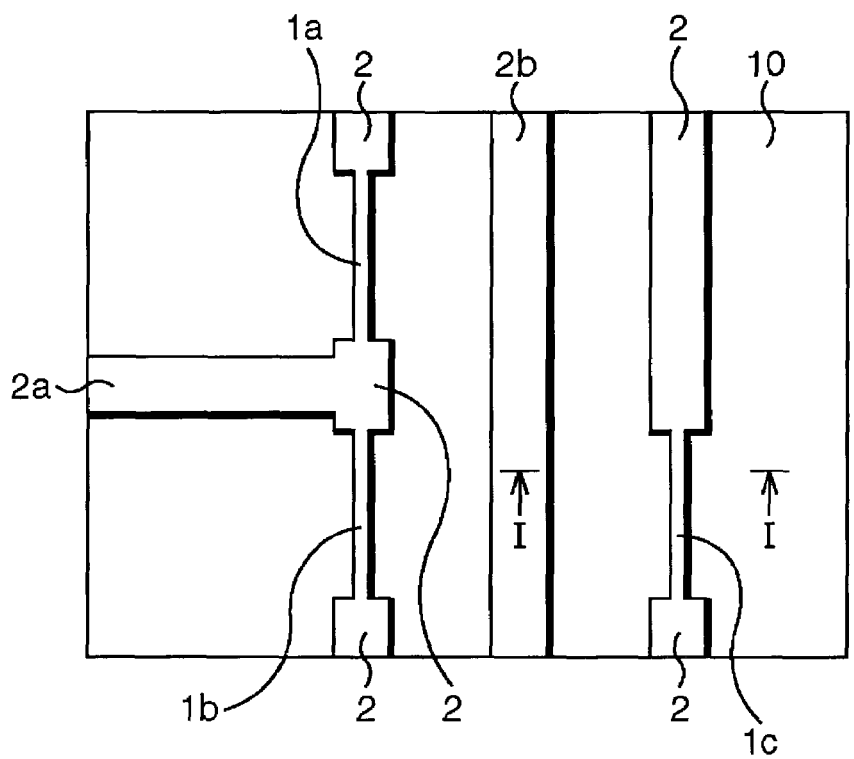
FIG. 1A and FIG. 1B are plan views showing patterns of a polycrystalline silicon layer which will be formed according to an embodiment of the present invention.
Figure 1B:
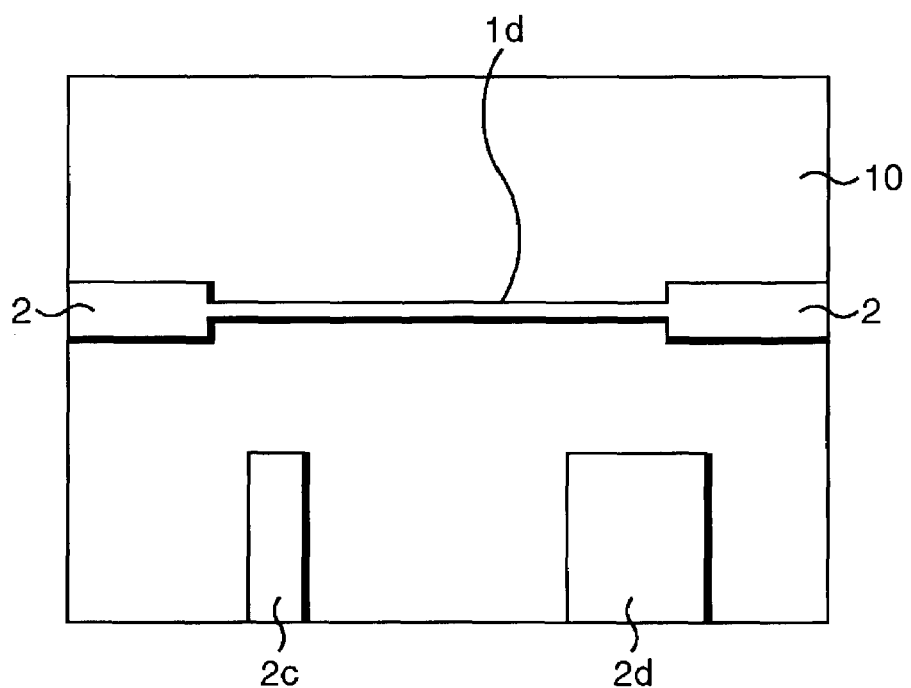

A method of manufacturing a semiconductor device relating to an embodiment of the present invention will be explained in detail hereinafter referring to attached drawings. FIG. 1A and FIG. 1B are plan views showing a patterns of polycrystalline silicon layer which will be formed according to the embodiment of the present invention. A first pattern shown in FIG. 1A and a second pattern shown in FIG. 1B are included in the patterns of the polycrystalline silicon layer.

As shown in FIG. 1A, the first pattern includes three gate electrodes 1a to 1c, all extending in the same direction. The gate electrodes 1a and 1b extend on one linear line. Further, the gate electrodes 1b and 1c locate on one linear line perpendicular to the direction along which the gate electrodes 1a to 1c extend. Wirings 2 extending in a manner to alienate from respective gate electrodes are connected to both ends of the respective gate electrodes 1a to 1c. Further a wiring 2a extending perpendicularly to the direction along which the gate electrodes 1a to 1c extend is connected to the wiring 2 connected between the gate electrodes 1a and 1b in a manner to alienate from the gate electrode 1c. Further, a wiring 2b extending in parallel to the gate electrodes 1a to 1c is disposed at an intermediate position between the gate electrodes 1b and 1c. Incidentally, these polycrystalline silicon layers are formed on a semiconductor substrate 10 via a gate insulating film (not shown).

As shown in FIG. 1B, the second pattern includes one piece of gate electrode 1d. Similarly to the first pattern, the wirings 2 are connected to both ends of the gate electrode 1d. Wirings 2c and 2d extending in the direction to alienate from the gate electrode 1d are arranged at a position apart from the gate electrode 1d.

Figure 2A:
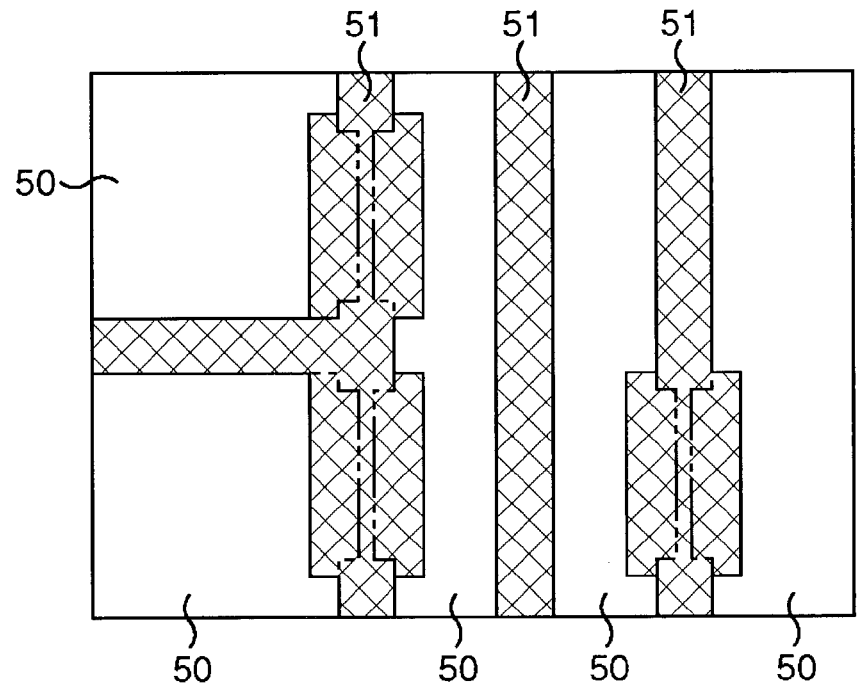
FIG. 2A and FIG. 2B are plan views showing patterns for wiring formation masks used in the embodiment of the present invention.
Figure 2B:
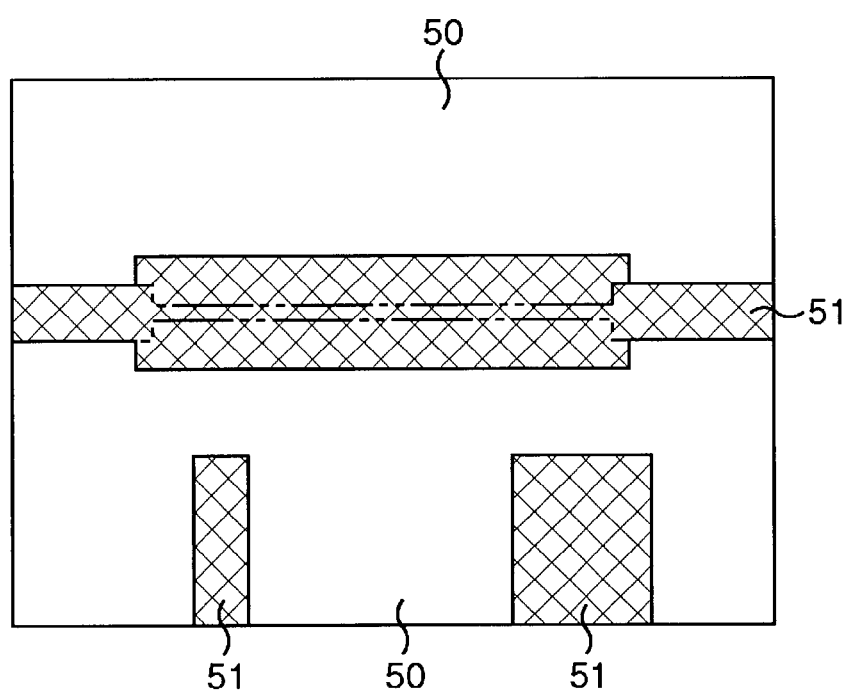
Figure 3A:
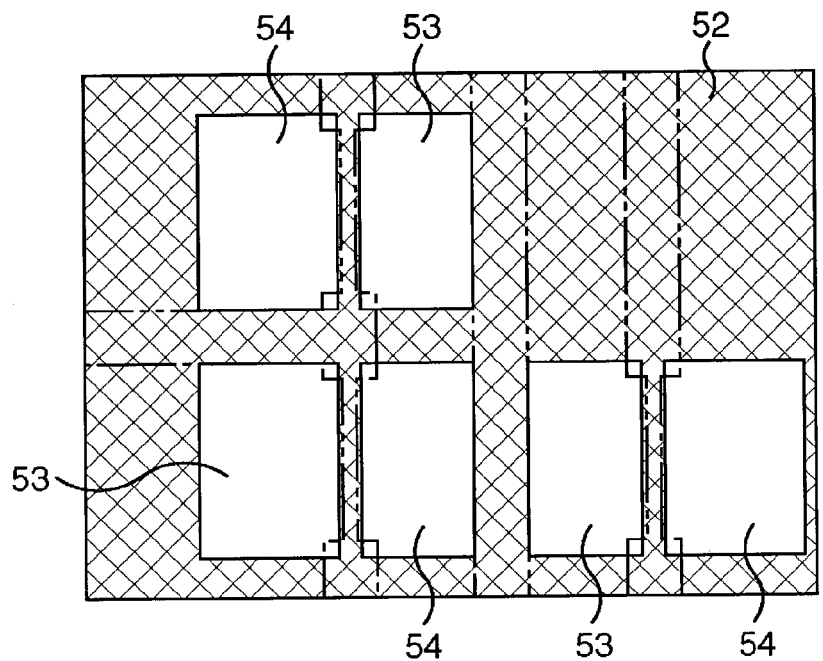
FIG. 3A and FIG. 3B are plan views showing patterns for gate electrode formation masks used in the embodiment of the present invention.
Figure 3B:
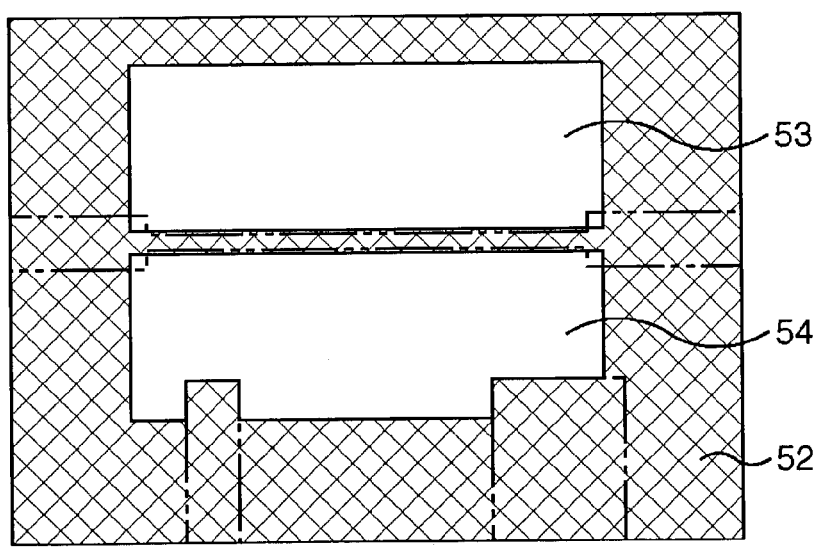

FIG. 2A and FIG. 2B are plan views showing patterns for wiring formation masks used in the embodiment of the present invention, and FIG. 3A and FIG. 3B are plan views showing patterns for gate electrode formation masks used in the embodiment of the present invention. A mask for wiring formation shown in FIG. 2A and FIG. 2B is, for instance, a binary mask or a half tone phase shift mask. When it is a binary mask, regions 51 shown with hatching in FIG. 2A and FIG. 2B are light shielding regions. When it is a half tone phase shift mask, the regions 51 shown in FIG. 2A and FIG. 2B are semi-transmission regions (transmittance: 6%). And, the circumferences around the semi-transmission regions or light shielding regions are transmission regions 50. In the meantime, the gate electrode formation masks shown in FIG. 3A and FIG. 3B are, for instance, Levenson phase shift masks, and regions 52 shown by hatching in FIG. 3A and FIG. 3B are light shielding regions. And when a phase of a transmission light in an aperture region 53 disposed in one side of the respective gate electrodes 1a to 1c is 0, a phase of a transmission light in an aperture region 54 disposed in the other side is $\pi$.

Though exposure is performed using two sheets of masks shown in FIGS. 2A, 2B and FIGS. 3A, 3B also in a conventional method, since the phase edge technology performs exposure by transferring mask patterns on two sheets to one resist film as described above, possibility of breaking down is extremely high in a portion where the wiring 2a shown in FIG. 1A comes close to the gate electrodes 1a and 1b, and a portion where the wiring 2b is sandwiched by the gate electrodes 1b and 1c. Besides, tip portions of the wirings 2c and 2d shown in FIG. 1B retract, which sometimes leads to troubles such as a contact failure and the like. Further, when trimming is performed to shorten the gate length, the whole wirings get narrower, which disturbs lowering of resistance.

Though masks similar to these are used in the embodiments of the present invention, it is possible to prevent the narrowing of the wiring even when gate length is shortened, by preventing narrowing of a region corresponding to wiring of the hard mask at the time of trimming, or by securing in advance a region corresponding to wiring of the resist film to be widely at the time of trimming. Concretely the following processes are performed.

-First Embodiment-

The first embodiment of the present invention will be explained first. FIG. 4A to FIG. 4K are sectional views showing a method of manufacturing a semiconductor device relating to the first embodiment of the present invention in process order. Incidentally, FIG. 4A to FIG. 4K correspond to a sectional view along the line I—I in FIG. 1A. FIGS. 5A and 5B to FIGS. 8A and 8B are plan views corresponding to states shown in FIG. 4B, FIG. 4D, FIG. 4F, and FIG. 4I respectively.

Figure 4C:
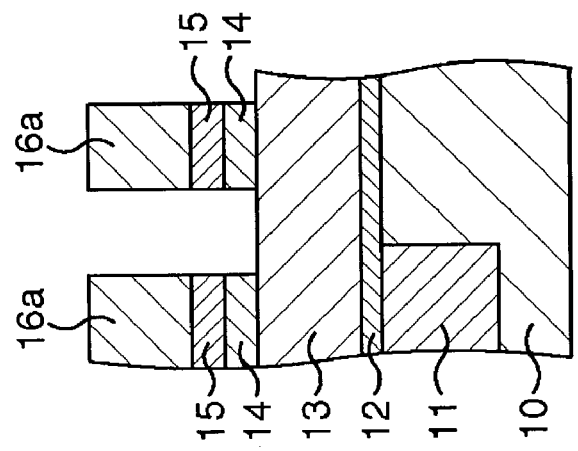
FIG. 4A to FIG. 4K are sectional views showing a method of manufacturing a semiconductor device relating to a first embodiment of the present invention in process order.
Figure 4B:
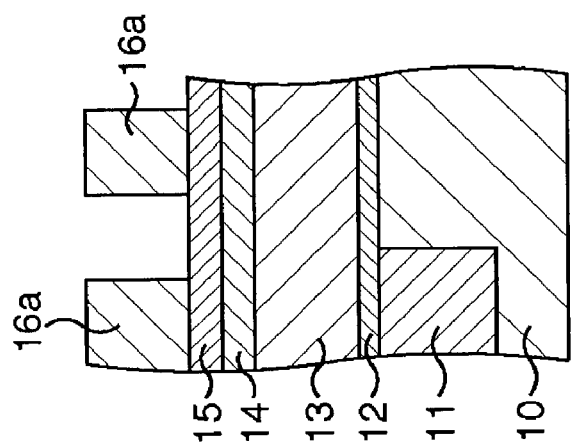
Figure 4A:
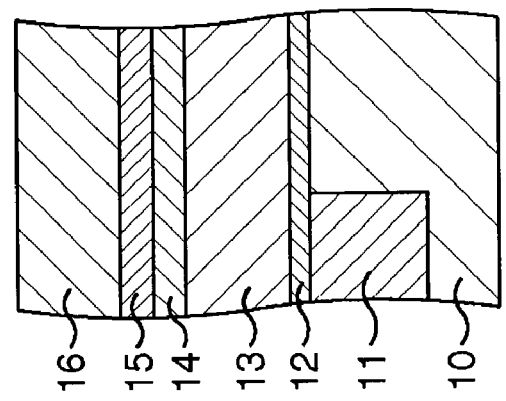

First, as shown in FIG. 4A, above a semiconductor substrate 10 on the surface of which an element isolating and insulating film 11 is formed, a gate oxidation film 12, a polycrystalline silicon film 13, a hard mask 14, an antireflection film 15, and a resist film 16 are formed in sequence. The thicknesses of the gate oxidation film 12, the polycrystalline silicon film 13, the hard mask 14, the antireflection film 15, and the resist film 16 are, for instance, 2 nm, 100 nm, 50 nm, 60 nm, and 300 nm respectively. As the hard mask 14, for instance, a $SiO_2$ film, a TEOS (tetraethylorthosilicate) film, a SiN film or a SiON film can be used. As the antireflection film 15, for instance, an organic coating type BARC (Bottom antireflection coating) can be used. Further, as the resist film 16, for instance, a positive type resist film for a KrF type excimer laser can be used.

Figure 5A:
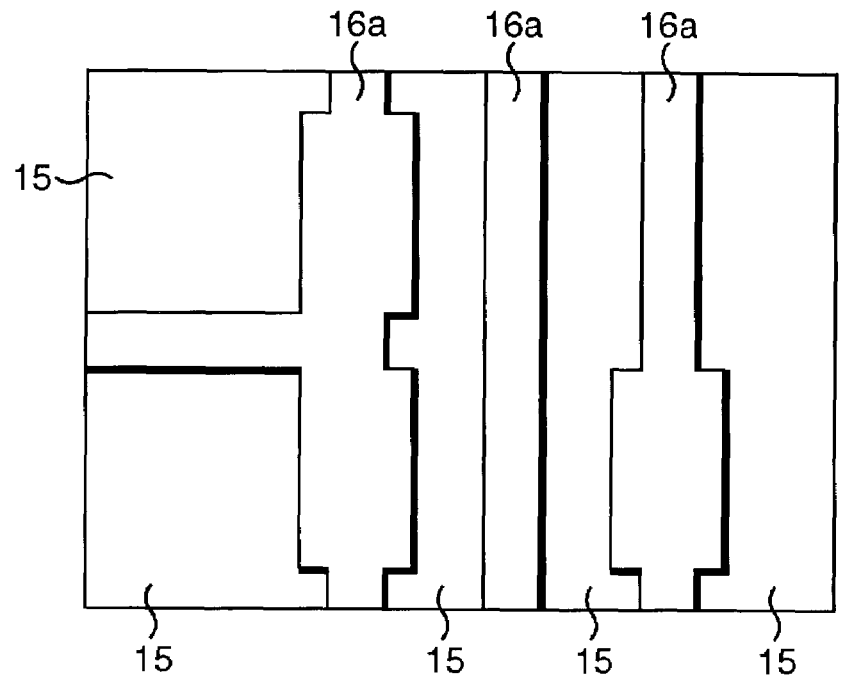
FIG. 5A and FIG. 5B are plan views corresponding to a state shown in FIG. 4D.
Figure 5B:
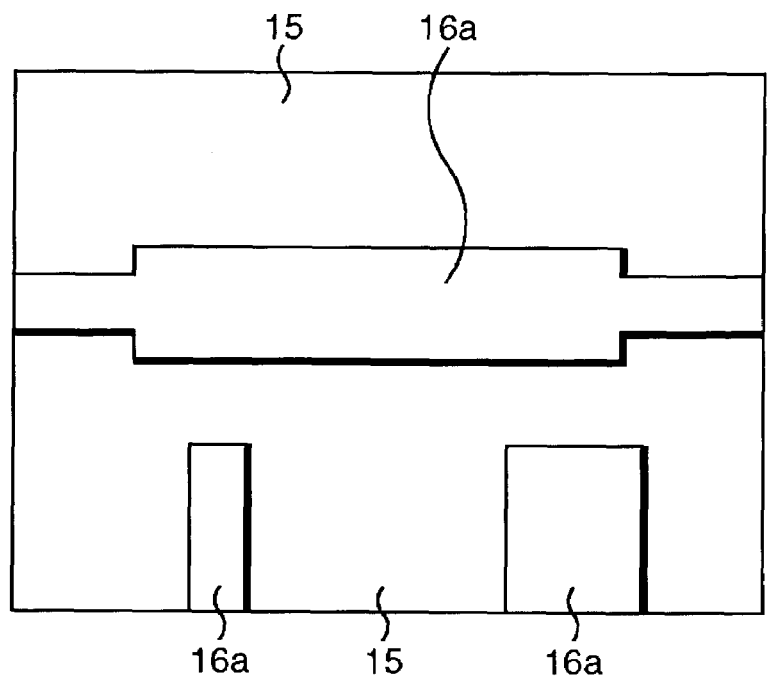

Then, the resist film 16 is exposed using a wiring formation masks shown in FIG. 2A and FIG. 2B. Concretely, a half tone phase shift mask having 6% transmittance in a semi-transmission region and a reduction projection type aligner are used. A numerical aperture NA is set to be, for instance, 0.60, and a ratio of numerical aperture $\sigma$ to be, for instance, 0.375/0.75 (=0.5). Zone illumination (½ Annular) is used while an amount of exposure is set to be about 30 mJ/cm$^2$, for instance. Thereafter, by development of the resist film 16, a resist pattern 16a of the resist film 16 is formed as shown in FIG. 4B, FIG. 5A and FIG. 5B. "½" of "½ Annular" is a value expressing a shape of the aperture diaphragm to express a ratio of the area of a region where light passes through to the area of a region where the light is blocked.

Thereafter, the antireflection film 15 and the hard mask 14 are etched using the resist pattern 16a as an etching mask as shown in FIG. 4C.

Figure 4D:
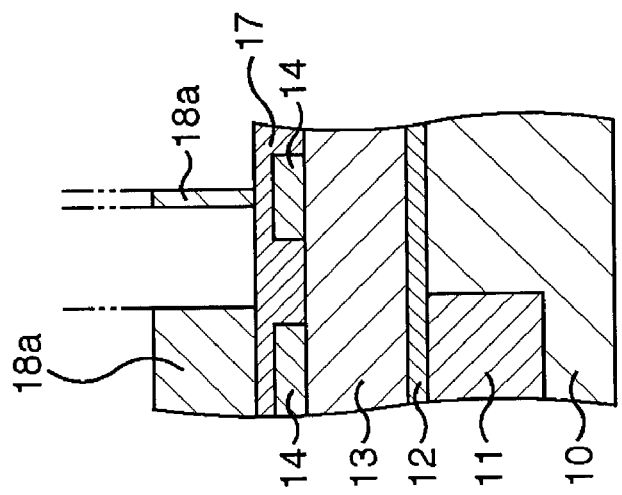
Figure 6A:
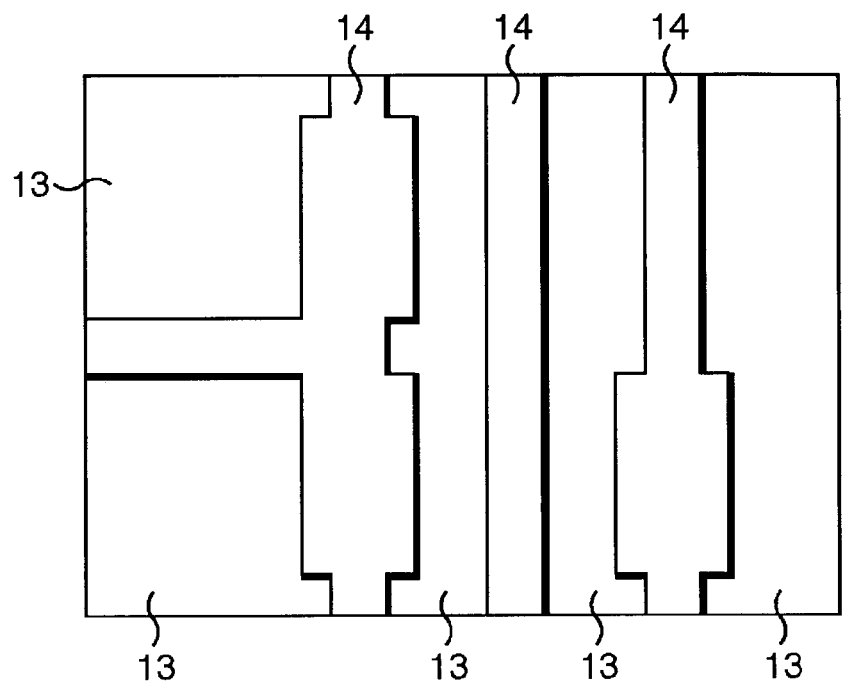
FIG. 6A and FIG. 6B are plan views corresponding to a state shown in FIG. 5A.
Figure 6B:
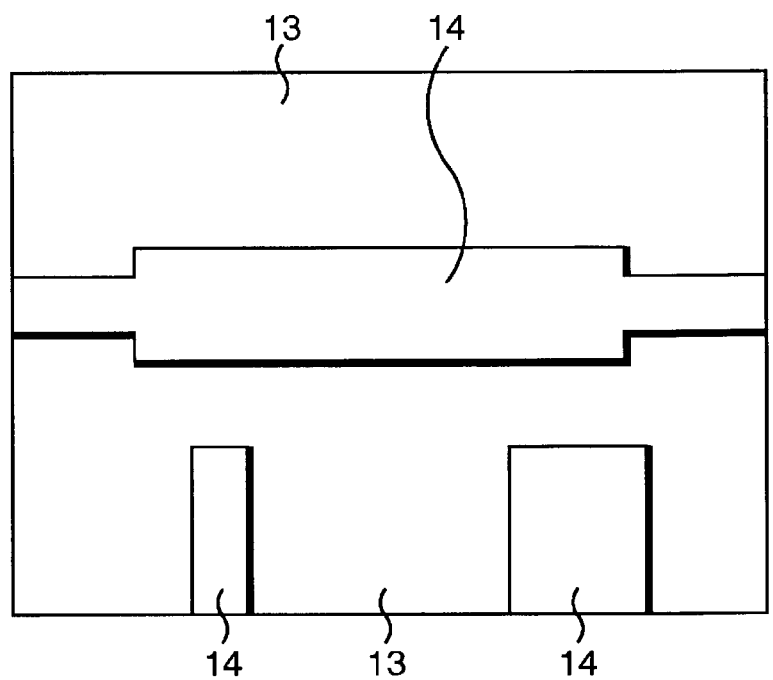

Then, the resist pattern 16a and the antireflection film 15 are removed as shown in FIG. 4D, FIG. 6A and FIG. 6B.

Figure 4E:
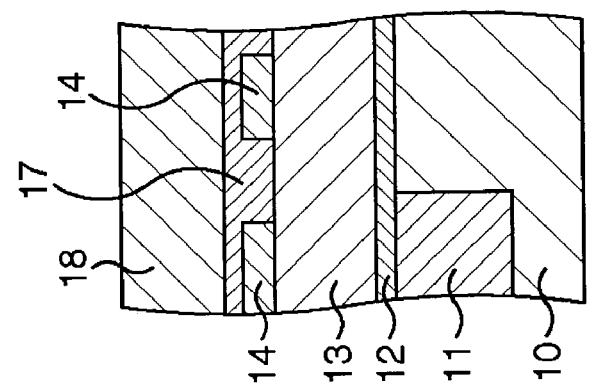

Subsequently, a new antireflection film 17 and a resist film 18 are formed on the whole surface as shown in FIG. 4E. As the antireflection film 17, for instance, a coating type BARC can be used. And as the resist film 18, for instance, a positive type resist film for a KrF type excimer laser can be used.

Figure 4F:
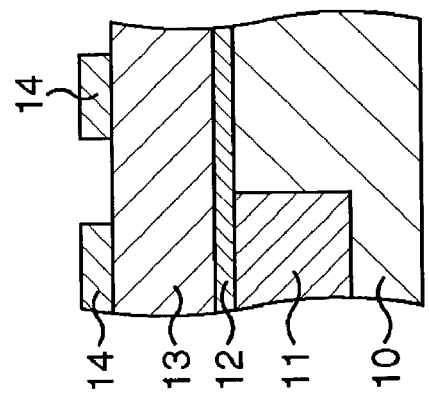
Figure 7A:
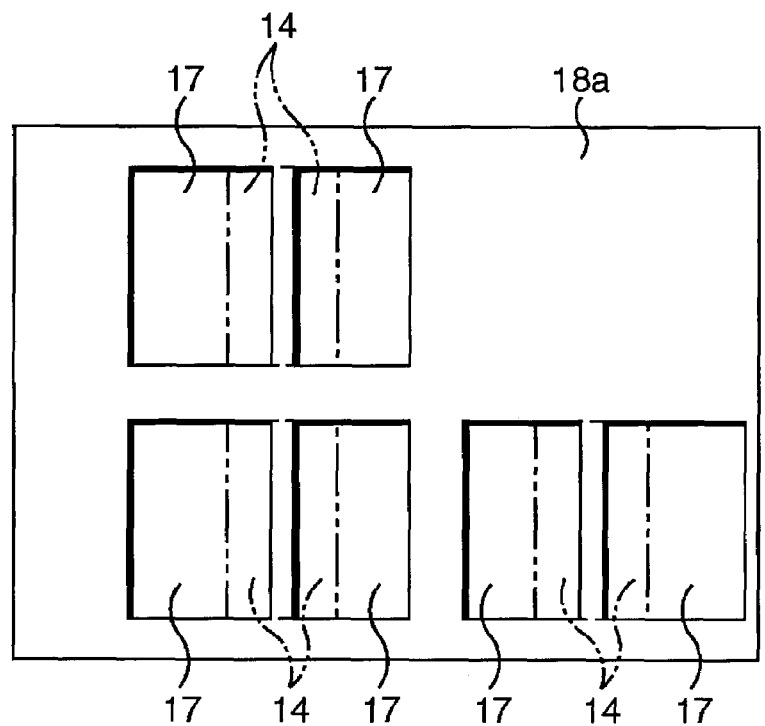
FIG. 7A and FIG. 7B are plan views corresponding to a state shown in FIG. 4F.
Figure 7B:
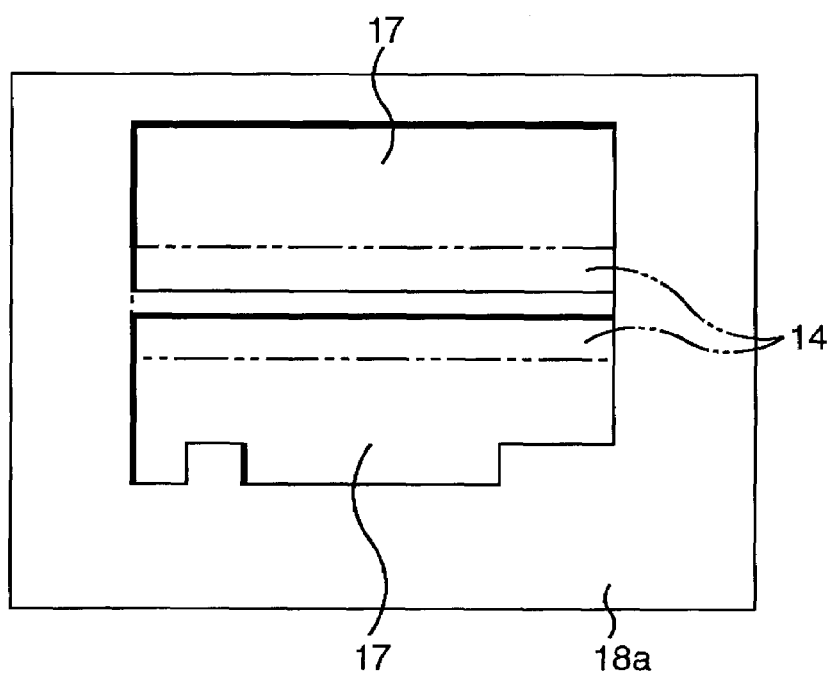

Then, the resist film 18 is exposed using gate electrode formation masks shown in FIG. 3A, and FIG. 3B. Concretely, a Levenson phase shift mask and a reduction projection type aligner are used. A numerical aperture NA is set to be, for instance, 0.68, a ratio of numerical aperture $\sigma$ to be, for instance, 0.40, and an amount of exposure is set to be about 25 to 30 mJ/cm$^2$. Thereafter, a resist pattern 18a of the resist film 18 is formed as shown in FIG. 4F, FIG. 7A and FIG. 7B by developing the resist film 18.

Figure 4I:
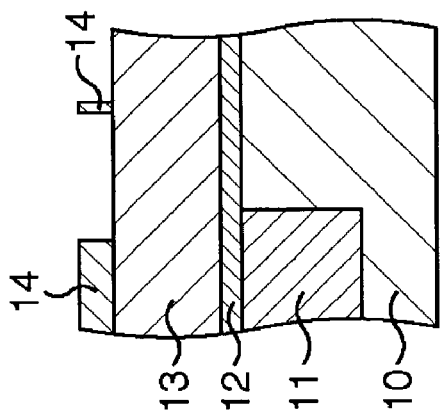
Figure 4H:
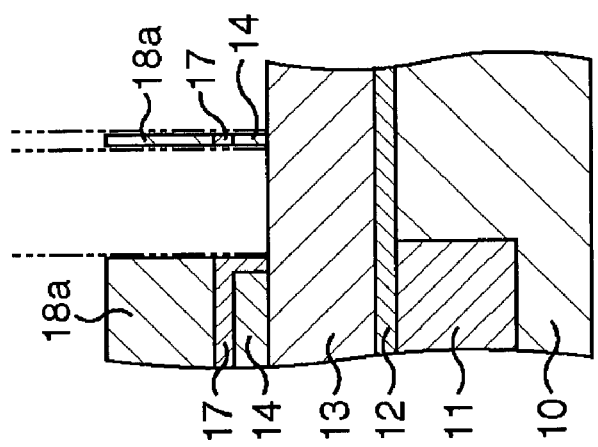
Figure 4G:
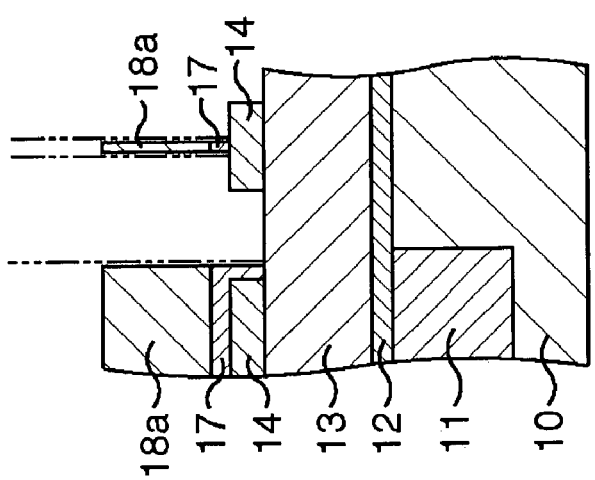

Then, as shown in FIG. 4G, the antireflection film 17 is etched using the resist pattern 18a as an etching mask, and trimming of the resist pattern 18a and the antireflection film 17 is performed. The manner of this trimming is not to etch the hard mask 14 made of an inorganic material but to etch the resist pattern 18a and the antireflection film 17 made of an organic material. For instance, gas flow rates of $Cl_2$ and $O_2$ are adjusted to 20 sccm and 30 to 50 sccm respectively, and a source power and a bias power to be about 200 W and 30 W respectively. Further, the pressure in a chamber is set to be about 1.33 Pa (10 mTorr), for instance. Further, for instance, 30% over-etching condition is adopted using an end point. When the width of the resist pattern 18a before trimming is 100 nm, the width is reduced to about 50 nm as the result of trimming like this.

Then, as shown in FIG. 4H, the hard mask 14 is etched using the trimmed resist pattern 18a and antireflection film 17 as etching masks.

Figure 8A:
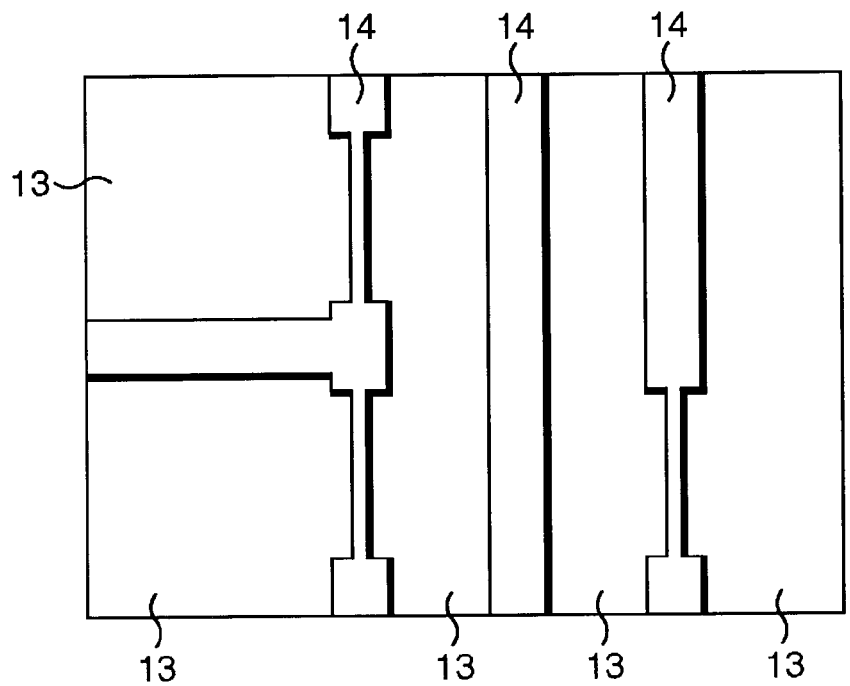
FIG. 8A and FIG. 8B are plan views corresponding to a state shown in FIG. 4I.
Figure 8B:
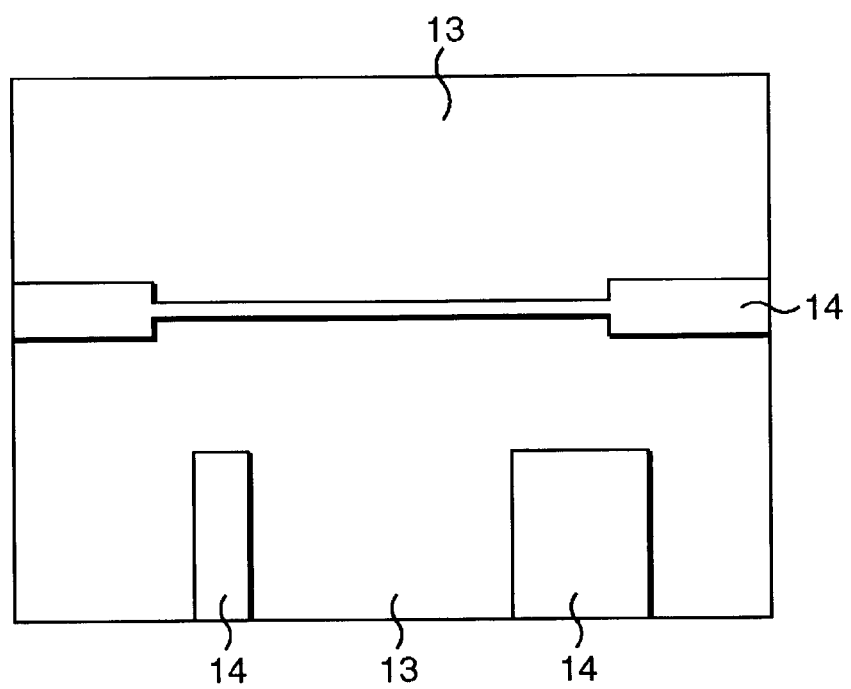

Next, as shown in FIG. 4I, FIG. 8A and FIG. 8B, the resist pattern 18a and the antireflection film 17 are removed.

Figure 4K:
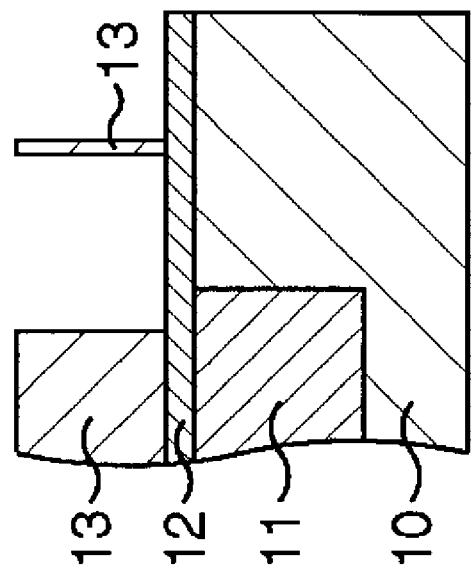
Figure 4J:
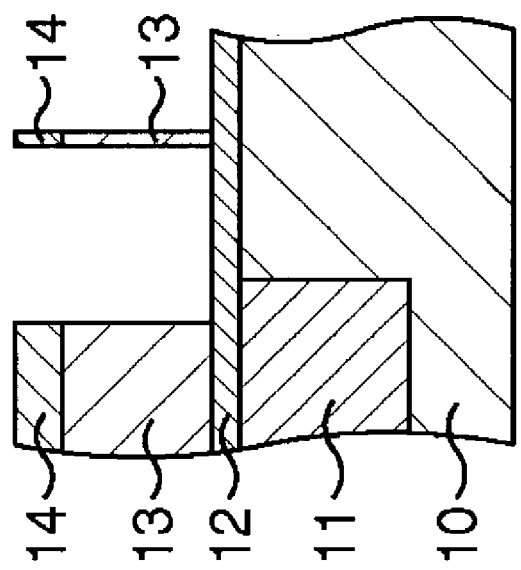

Subsequently, as shown in FIG. 4J, the polycrystalline silicon film 13 is etched using the hard mask 14 as an etching mask.

Then, as shown FIG. 4K, the hard mask 14 is removed.

According to the first embodiment as above, a region which is consistent with the wiring pattern of the hard mask 14 is covered with the resist pattern 18a completely before and after trimming of the resist pattern 18a and the antireflection film 17 to form the gate electrode pattern having a desired size. Therefore, it becomes possible to prevent breaking down and retraction of the wiring by etching the polycrystalline silicon film 13 using the hard mask 14 patterned with the resist pattern 18a, as an etching mask. Accordingly, it is possible to shorten the gate length appropriately while maintaining the wiring having desired characteristics.

Note that the hard mask 14 needs not to be removed immediately after removing the polycrystalline silicon film 13.

-Second Embodiment-

The second embodiment of the present invention will be explained next. FIG. 9A to FIG. 9K are sectional views showing a method of manufacturing a semiconductor device relating to the second embodiment of the present invention in process order. Incidentally, FIG. 9A to FIG. 9K correspond to sectional views along the line I—I in FIG. 1A. FIGS. 10A and 10B to FIGS. 13A and 13B are plan views corresponding to FIG. 9B, FIG. 9E, FIG. 9G, and FIG. 9I.

Figure 9C:
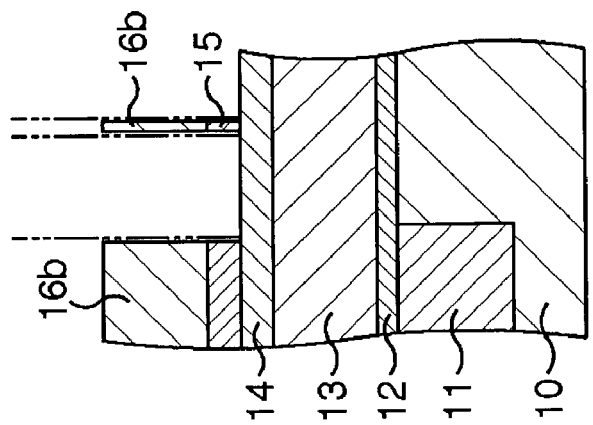
FIG. 9A to FIG. 9K are sectional views showing a method of manufacturing a semiconductor device relating to a second embodiment of the present invention in process order.
Figure 9B:
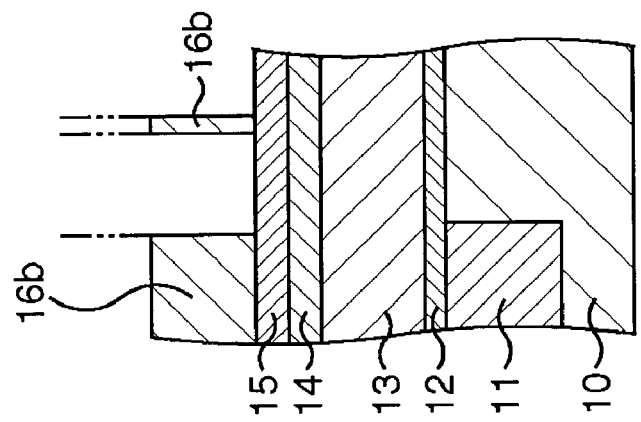
Figure 9A:
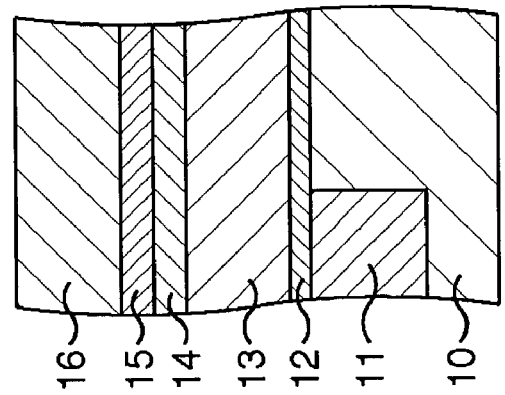

First, as shown in FIG. 9A, above a semiconductor substrate 10 on the surface of which an element isolating and insulating film 11 is formed, a gate oxidation film 12, a polycrystalline silicon film 13, a hard mask 14, an antireflection film 15, and a resist film 16 are formed in sequence, similarly to the first embodiment.

Figure 10A:
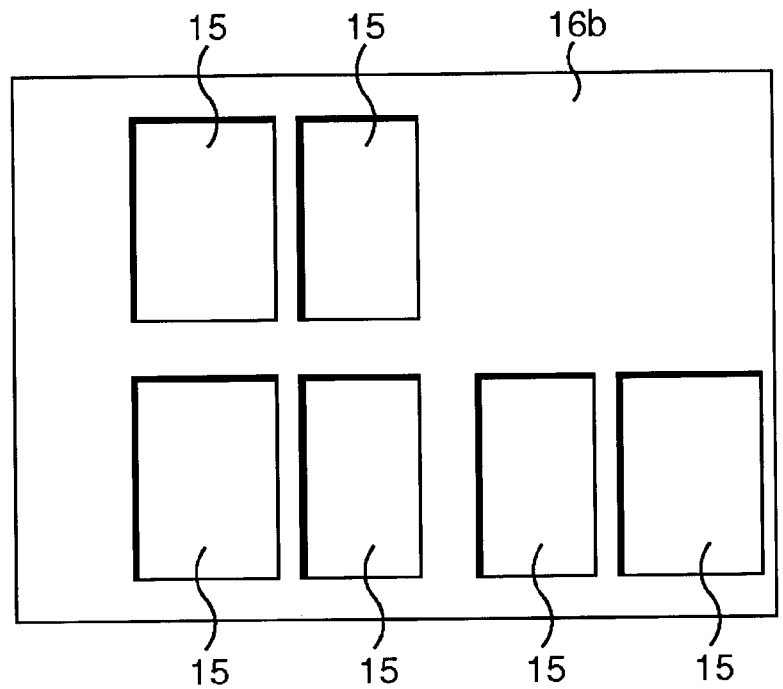
FIG. 10A and FIG. 10B are plan views corresponding to a state shown in FIG. 9B.
Figure 10B:
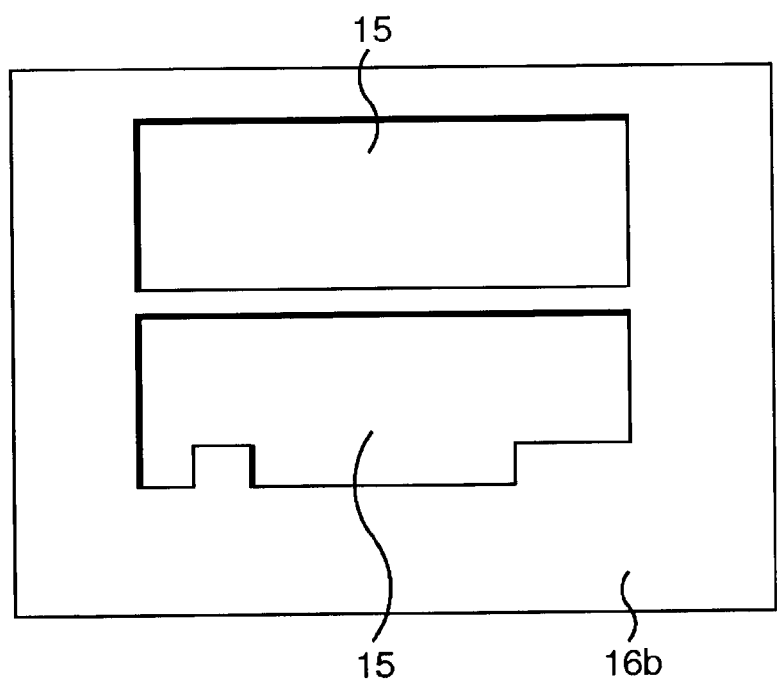

Then, the resist film 16 is exposed using gate electrode formation masks shown in FIG. 3A and FIG. 3B. Concretely, a Levenson phase shift mask and a reduction projection type aligner are used. A numerical aperture NA is set to be, for instance, 0.68, a ratio of numerical aperture σ to be, for instance, 0.40, and an amount of exposure to be about 25 to 30 $mJ/cm^2$, for instance. Thereafter, by development of the resist film 16, a resist pattern 16b of the resist film 16 is formed as shown in FIG. 9B, FIG. 10A and FIG. 10B.

Thereafter, the antireflection film 15 is etched using the resist pattern 16b as an etching mask as shown in FIG. 9C, and trimming of the resist pattern 16b and the antireflection film 15 is performed. The manner of this trimming is not to etch the hard mask 14 made of an inorganic material but to etch the resist pattern 16b and the antireflection film 15 made of an organic material similarly to the trimming in the first embodiment.

Figure 9D:
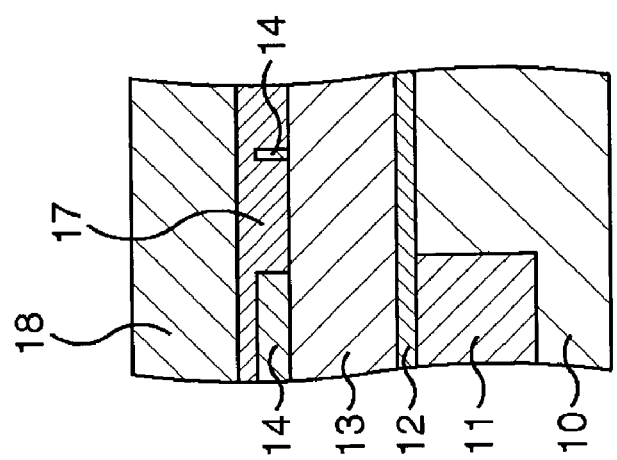

Then, as shown in FIG. 9D, the hard mask 14 is etched using the trimmed resist pattern 16b and antireflection film 15 as etching masks.

Figure 9E:
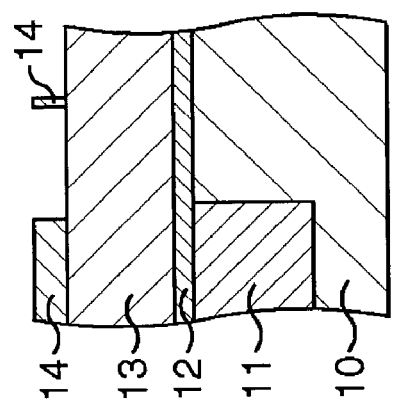
Figure 11A:
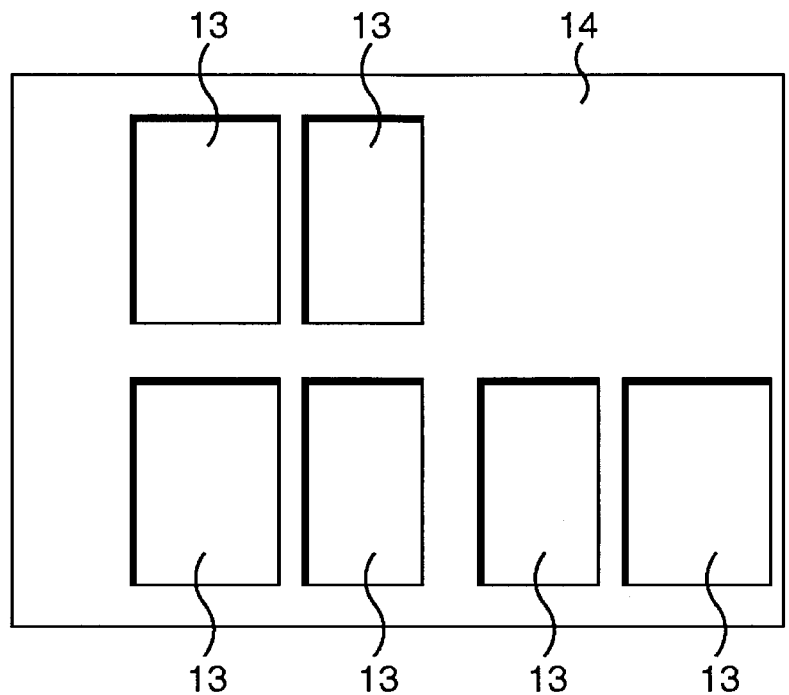
FIG. 11A and FIG. 11B are plan views corresponding to a state shown in FIG. 9E.
Figure 11B:
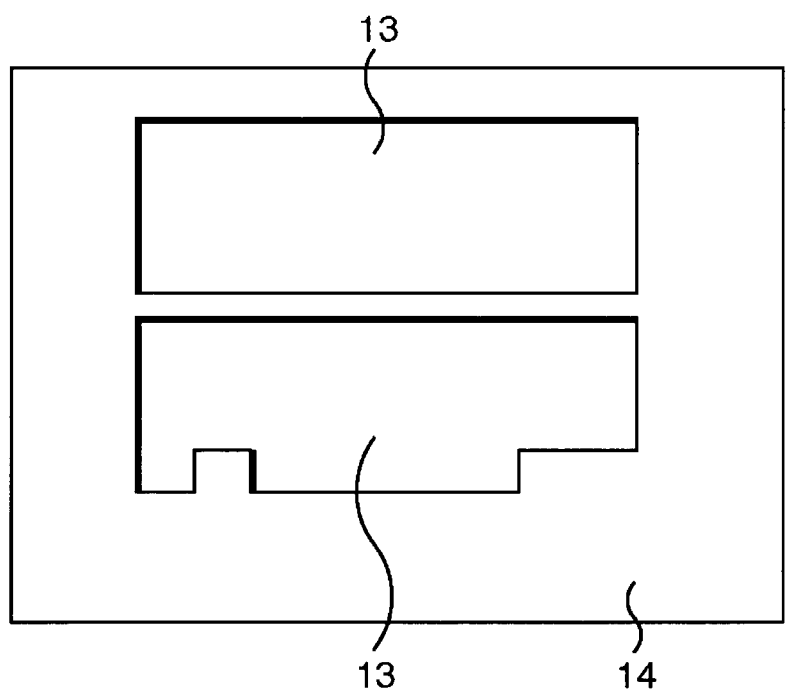

Next, as shown in FIG. 9E, FIG. 11A and FIG. 11B, the resist pattern 16b and the antireflection film 15 are removed.

Figure 9F:
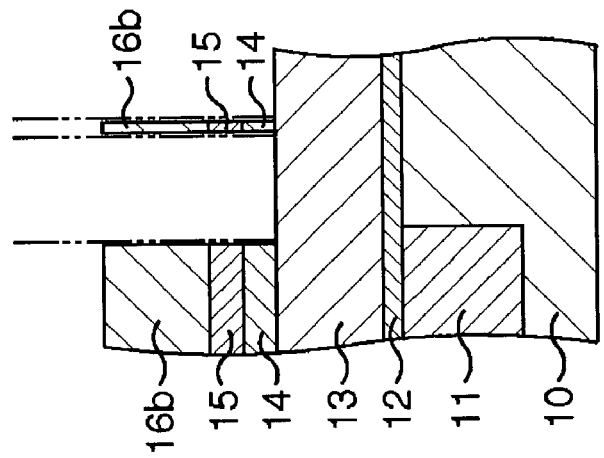

Subsequently, a new antireflection film 17 and a resist film 18 are formed on the whole surface as shown in FIG. 9F.

Figure 9G:
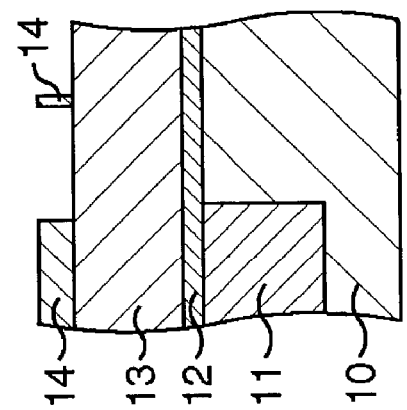
Figure 12A:
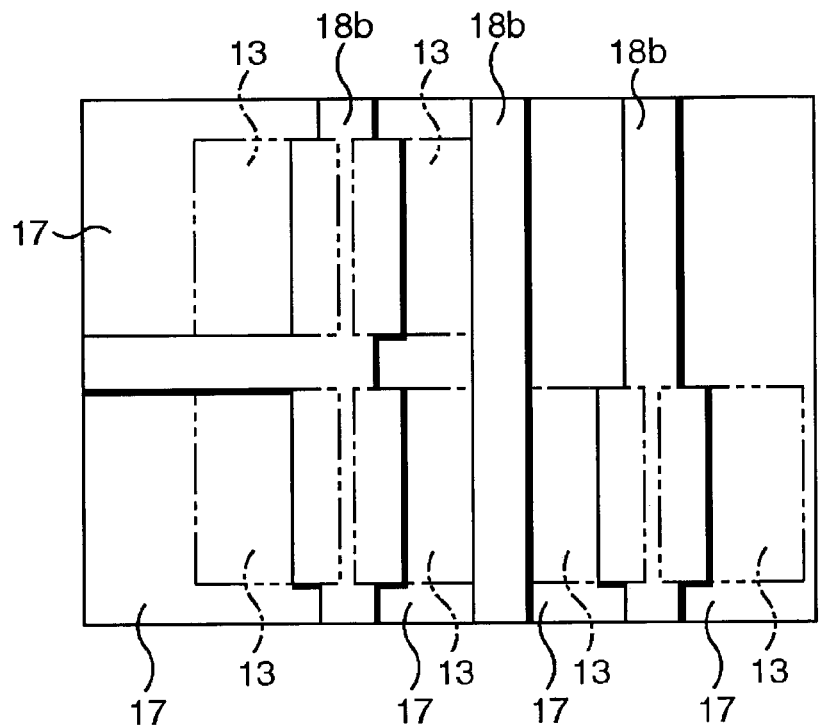
FIG. 12A and FIG. 12B are plan views corresponding to a state shown in FIG. 9G.
Figure 12B:
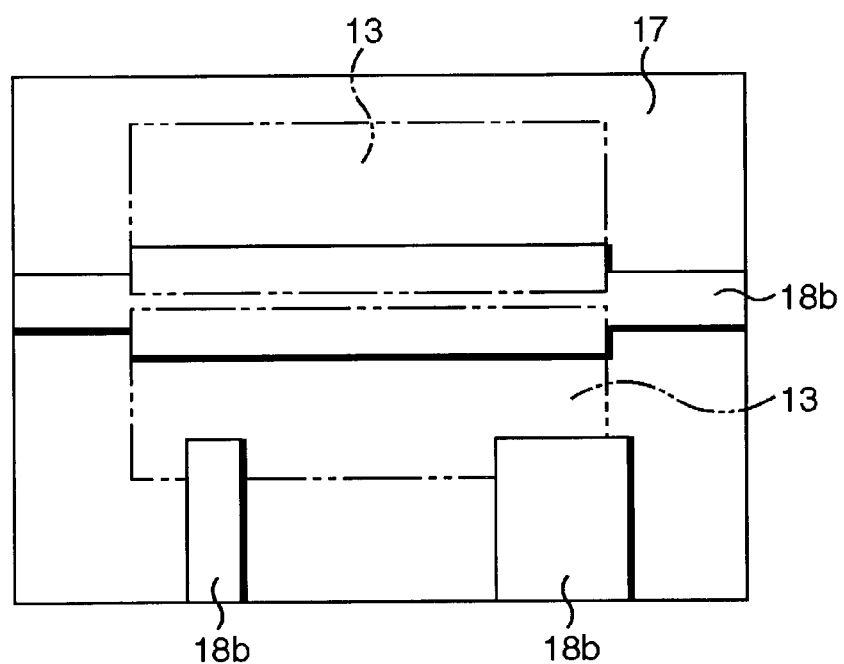

Then, the resist film 18 is exposed using wiring formation masks shown in FIG. 2A and FIG. 2B. Concretely, a half tone phase shift mask having 6% transmittance in a semi-transmission region and a reduction projection type aligner are used. A numerical aperture NA is set to be, for instance, 0.60, a ratio of numerical aperture σ to be, for instance, 0.375/0.75 (=0.5). Zone illumination (½ Annular) is used while an amount of exposure is set to be about 30 $mJ/cm^2$, for instance. Thereafter, by development of the resist film 18, a resist pattern 18b of the resist film 18 is formed as shown in FIG. 9G, FIG. 12A and FIG. 12B.

Figure 9H:
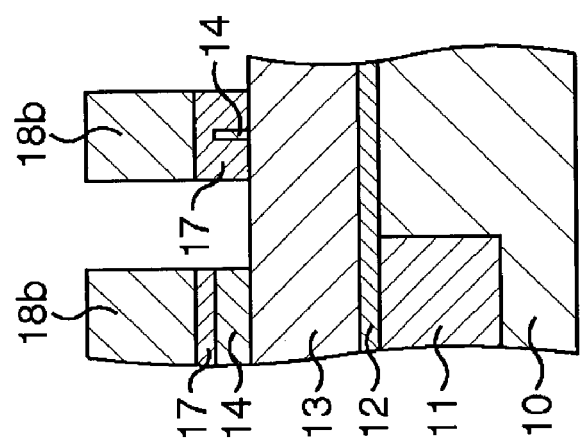

Thereafter, the antireflection film 17 and the hard mask 14 are etched using the resist pattern 18b as an etching mask as shown in FIG. 9H.

Figure 9I:
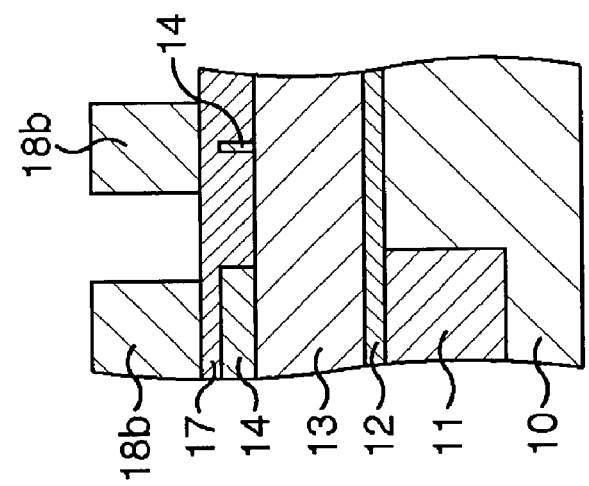
Figure 13A:
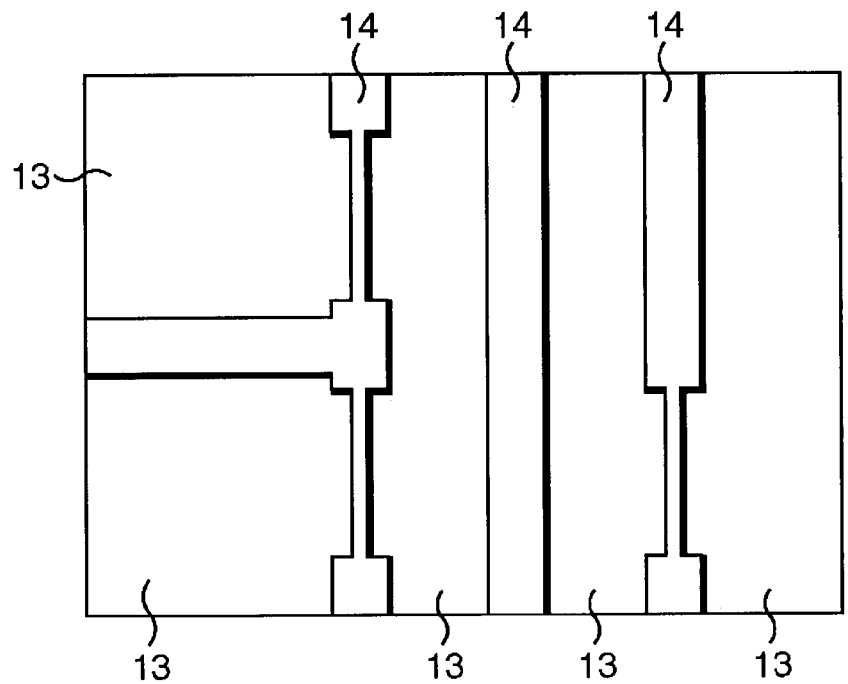
FIG. 13A and FIG. 13B are plan views corresponding to a state shown in FIG. 9I.
Figure 13B:
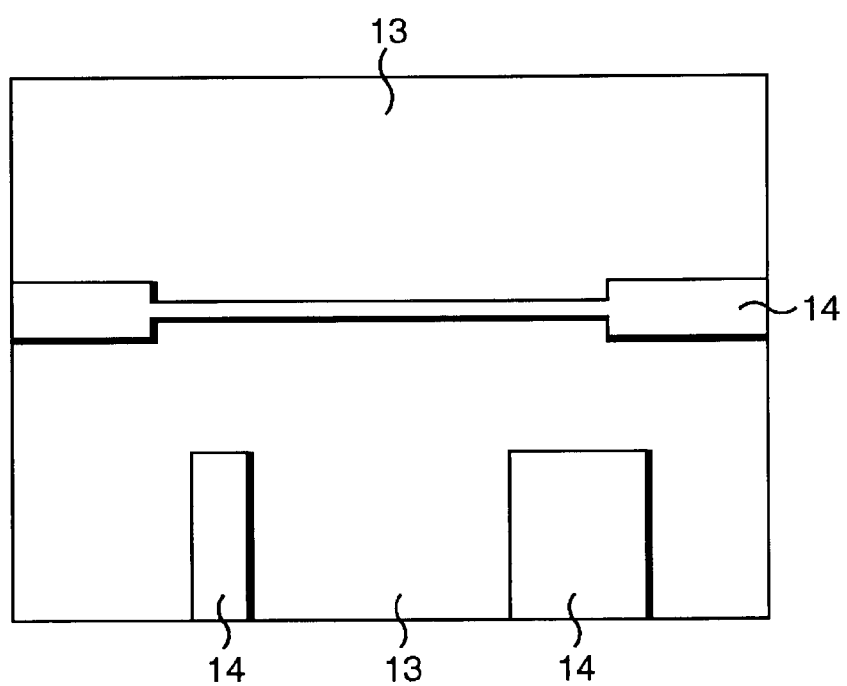

Then, the resist pattern 18b and the antireflection film 17 are removed as shown in FIG. 9I, FIG. 13A and FIG. 13B.

Figure 9K:
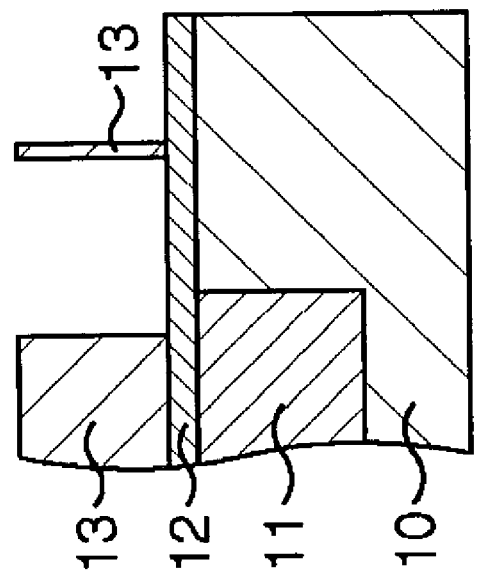
Figure 9J:
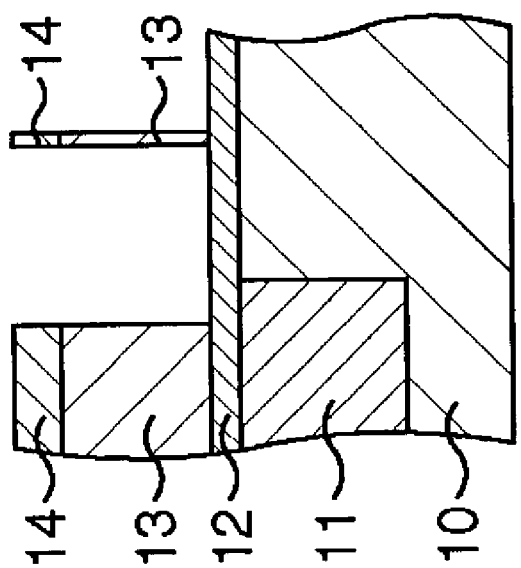

Subsequently, as shown in FIG. 9J, the polycrystalline silicon film 13 is etched using the hard mask 14 as an etching mask.

Then, as shown in FIG. 9K, the hard mask 14 is removed.

According to the second embodiment as above, a region which is consistent with the wiring pattern of the hard mask 14 is covered with the resist pattern 16b completely, before and after trimming of the resist pattern 16b and the antireflection film 15 to form the gate electrode pattern having a desired size. Therefore, a similar effect to the first embodiment can be obtained. Further, a gate electrode having a more uniform size can be formed compared with the first embodiment. This is because there is the possibility that the thicknesses of the antireflection film 17 and the resist film 18 become uneven in the vicinity of a region forming the gate electrode, depending on the thickness of the hard mask 14 so that the size of the resist pattern 18a also becomes uneven in the first embodiment.

Note that the hard mask 14 needs not to be removed immediately after removing the polycrystalline silicon film 13 similarly to the first embodiment.

Figure 14A:
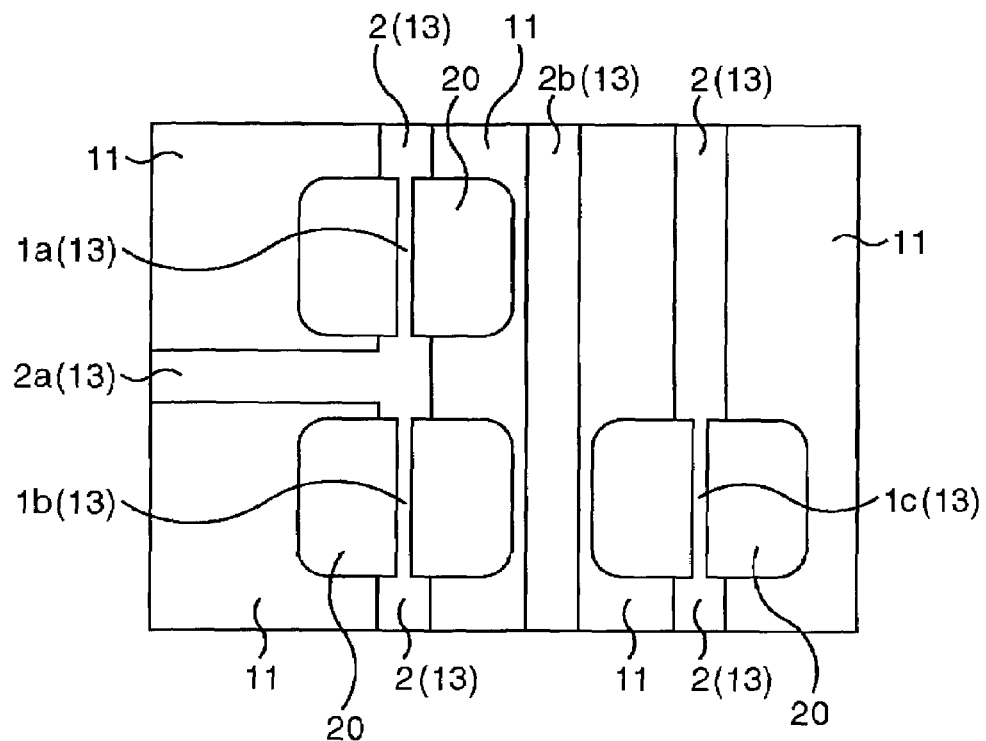
FIG. 14A and FIG. 14B are layout drawings showing a state after forming gate electrodes and wirings in the first and second embodiments of the present invention.
Figure 14B:
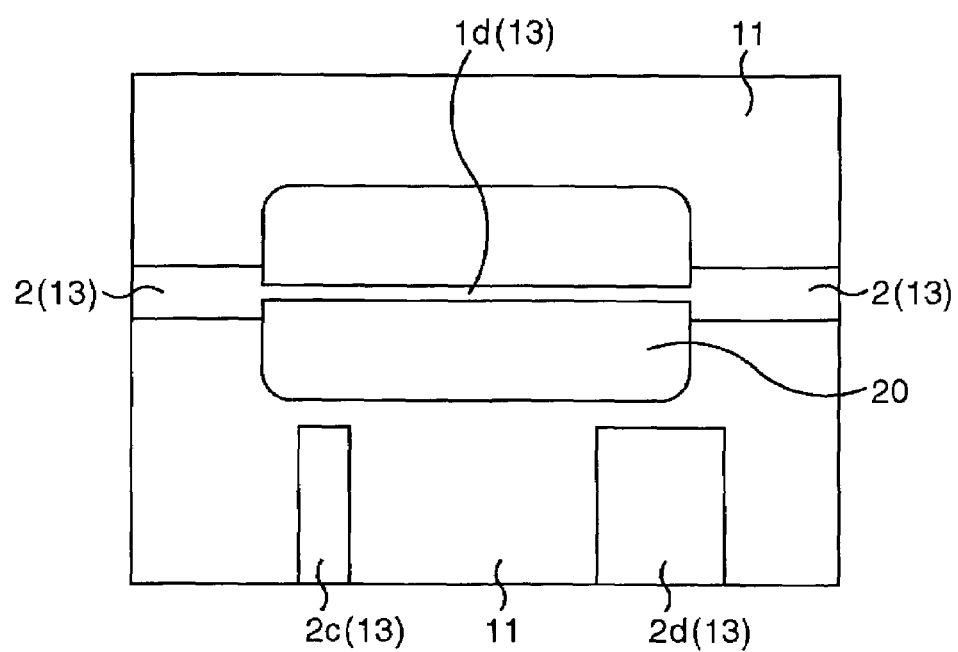

FIG. 14A and FIG. 14B are layout drawings showing a state after forming gate electrodes and wirings in the first and second embodiments of the present invention. Element active regions 20 defined by the element isolating and insulating film 11 exist in the vicinity of the respective gate electrodes 1a to 1d.

Figure 15A:
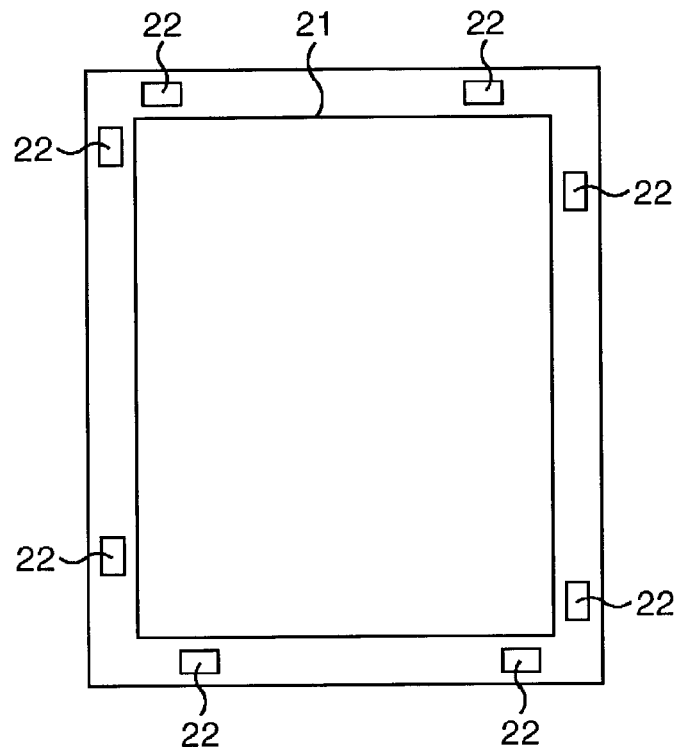
FIG. 15A and FIG. 15B are schematic diagrams showing alignment marks formed on two sheets of exposure masks.
Figure 15B:
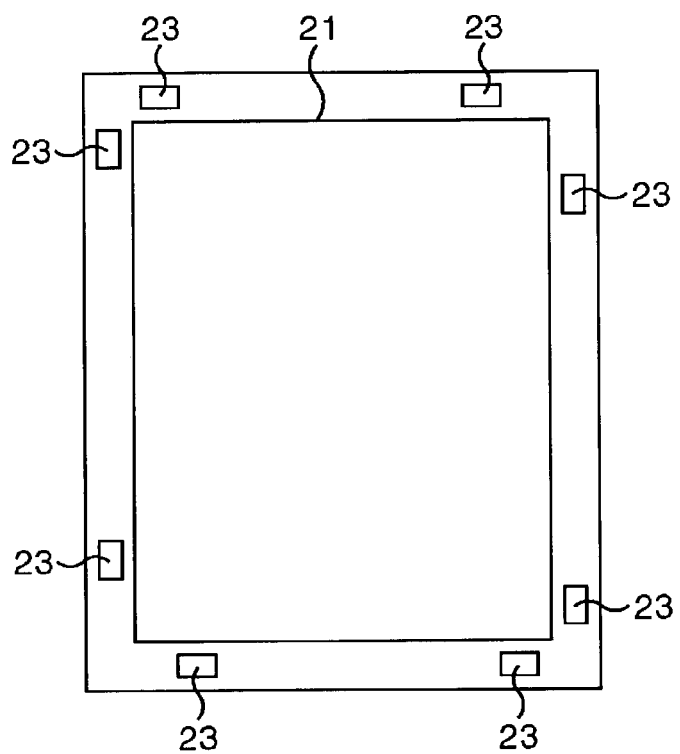

A method to improve the accuracy of alignment between two sheets of the exposure masks will be explained next. The method can be applied to both of the first and second embodiments. FIG. 15A and FIG. 15B are schematic diagrams showing alignment marks formed on two sheets of exposure masks.

In the exposure mask used in the former exposure, plural pieces, for instance, 8 pieces of alignment marks 22 are formed in advance in the surroundings of the pattern region for the device 21 as shown in FIG. 15A. These alignment marks 22 serve as a light shielding region. While in an exposure mask used in the latter exposure, plural pieces, for instance, 8 pieces of alignment marks 23 are formed in advance in the surroundings of the pattern region for the device 21 at the positions to be consistent with the alignment marks 22 as shown in FIG. 15B. These alignment marks 23 serve as a transmission region.

In the former exposure, the exposure mask shown in FIG. 15A is used with reference to the alignment marks inserted in advance into the active region layer and the like which is a semiconductor substrate or an underground pattern. As a result, regions light-shielded by the alignment marks 22 of the resist film remain by the subsequent development. Consequently, the pattern of the alignment marks 22 is transferred on the hard mask by etching using the resist pattern and the hard mask remains on these portions as alignment marks. In the latter exposure, the exposure mask shown in FIG. 15B is used with reference to the hard mask remaining as this alignment mark. At this time, since plural pieces of alignment marks exist in a shot, high alignment accuracy can be ensured. Further, since the alignment marks 23 are transmission regions, regions on the hard mask which remain as alignment marks of the resist film, are removed by subsequent development. Hence, the hard mask remaining as alignment marks is removed by etching with the resist pattern. Therefore, even in the case when a step of removing the hard mask intentionally is not provided as in the process shown in FIG. 4K or FIG. 9K, a pattern on a further upper layer can be formed in this region.

It should be noted that the above-described method is for a case to use a positive type as the resist film, but for a case to use a negative type as the resist film, the relationship of transmission to light-shielding should be reversed.

Further, in the first and second embodiment, it is preferable to give proximity effect correction to both two sheets of the exposure masks to be used. This is because while the exposure mask to determine the size of the gate electrode (the second region) is a Levenson phase shift mask, the exposure mask to determine the size of the wiring (the first region) is, for instance, a half tone phase shift mask.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As described above in detail, according to the present invention, it is possible to reduce the size of the second region which can be used as a gate electrode and the like to a desired size by trimming while preventing narrowing, breaking down, and retraction of the first region which can be used as wiring and the like.

What is claimed is:

1. A method of manufacturing a semiconductor device in which a first region and a second region narrower in width than that in said first region exist in a film, said method comprising the steps of:
    forming a hard mask on said film to be processed;
    forming a first resist film on said hard mask;
    processing said first resist film into a shape at least to define by covering a first portion in said film to be processed and to cover a portion including a second portion in said film to be processed;
    etching said hard mask using said first resist film as a mask;
    removing said first resist film;
    forming a second resist on the whole surface;
    processing said second resist film into a shape at least to cover a portion wider than the contour of said first portion in said film to be processed and to cover a portion wider than the contour of said second portion in said film to be processed;
    processing said second resist film into a shape at least to cover a portion including said first portion in said film to be processed and to define by covering said second portion in said film to be processed, by selectively trimming said second resist film;
    etching said hard mask using said second resist film as a mask; and
    etching said film to be processed using said hard mask as a mask, thereby forming said first region in said first portion and said second region in said second portion.

2. The method of manufacturing a semiconductor device according to claim 1, wherein the step of trimming said second resist film uses a mixture of $Cl_2$ gas and $O_2$ gas or a mixture of inert gas and $O_2$ gas.

3. The method of manufacturing a semiconductor device according to claim 1, wherein the step of processing said first resist film and second resist film include steps of exposing said first resist film and said second resist film respectively, and two sheets of exposure masks used for exposing said first resist film and second resist film respectively are given proximity effect corrections independently of each other.

4. The method of manufacturing a semiconductor device according to claim 1, wherein the step of processing said first resist film includes a step of exposing said first resist film using a phase shift mask as an exposure mask.

5. The method of manufacturing a semiconductor device according to claim 1, wherein the step of processing said second resist film includes a step of exposing said second resist film using a phase shift mask as an exposure mask.

6. The method of manufacturing a semiconductor device according to claim 1, wherein the step of processing said second resist film includes a step of exposing said second resist film using a Levenson phase shift mask as an exposure mask.

7. The method of manufacturing a semiconductor device according to claim 1, wherein the step of forming the first resist film an said hard mask includes the steps of: forming a first antireflection film made of an organic material on said hard mask; and forming said first resist film on said film antireflection film, and
    wherein the step of etching said hard mask using said first resist film as a mask is a step of etching said first antireflection film and said hard mask using first resist film as a mask.

8. The method of manufacturing a semiconductor device according to claim 7, wherein the step of processing said first resist film by trimming said first resist film, said first antireflection film is processed into the same pattern as said first resist film by trimming said first antireflection film.

9. The method of manufacturing a semiconductor device according to claim 1, wherein the step of forming the second resist film on said whole surface includes the step of:
    forming a second antireflection film made of an organic material on the whole surface; and
    forming said second resist film on said second antireflection film, and
    wherein the step of etching said hard mask using said second resist film as a mask is a step of etching said second antireflection film and said hard mask using said second resist film as a mask film.

10. The method of manufacturing a semiconductor device according to claim 9, wherein in the step of processing said second resist film by trimming said second resist film, said second antireflection film is processed into the same pattern as said second resist film by trimming said second antireflection film.

11. The method of manufacturing a semiconductor device according to claim 1, wherein in the step of processing said first resist film, a pattern of an alignment mark is formed on the first resist film and an exposure mask to be used for exposure of said second resist film is aligned with reference to said alignment mark.

12. The method of manufacturing a semiconductor device according to claim 11, wherein a pattern to eliminate said alignment mark is formed on the exposure mask to be used for exposure of said second resist film.

13. The method of manufacturing a semiconductor device according to claim 1, wherein said second region is a gate electrode of a transistor.

14. The method of manufacturing a semiconductor device according to claim 13, wherein said first region includes wiring to which said gate electrode is connected.

15. The method of manufacturing a semiconductor device according to claim 1, wherein said hard mask is made of an inorganic material.

16. The method of manufacturing a semiconductor device according to claim 1, further comprising a step of removing said hard mask after the step of etching said film to be processed.

17. A method of manufacturing a semiconductor device in which a first region and a second region narrower in width than that in said first region exist in a film, said method comprising the steps of:
   forming a hard mask on said film to be processed;
   forming a first resist film on said hard mask;
   processing said first resist film into a shape at least to cover a portion wider than the contour of a first portion in said film to be processed and to cover a portion wider than the contour of a second portion in said film to be processed;
   processing said first resist film into a shape at least to cover a portion including said first portion in said film to be processed and to define by covering said second portion in said film to be processed, by selectively trimming said first resist film;
   etching said hard mask using said first resist film as a mask;
   removing said first resist film;
   forming a second resist film on the whole surface;
   processing said second resist film into a shape at least to define by covering said first portion in said film to be processed and to cover a portion including said second portion in said film to be processed;
   etching said hard mask using second resist film as a mask; and
   etching said film to be processed using hard mask as a mask, thereby forming said first region in said first portion and said second region in said second portion.

18. The method of manufacturing a semiconductor device according to claim 17, wherein the step of trimming said first resist film uses a mixture of $Cl_2$ gas and $O_2$ gas or a mixture inert gas and $O_2$ gas.

19. The method of manufacturing a semiconductor device according to claim 17, wherein the steps of processing said first resist film and said second resist film include steps of exposing said first resist film and said second resist film respectively, and two sheets of exposure masks used for exposing said first resist film and second resist film respectively are given proximity effect corrections independently of each other.

20. The method of manufacturing a semiconductor device according to claim 17, wherein the step of processing said first resist film includes a step of exposing said first resist film using a phase shift mask as an exposure mask.

21. The method of manufacturing a semiconductor device according to claim 17, wherein the step of processing said second resist film includes a step of exposing said second resist film using a phase shift mask as an exposure mask.

22. The method of manufacturing a semiconductor device according to claim 17, wherein the step of processing said first film includes a step of exposing said first resist film using a Levenson phase shift mask as an exposure mask.

23. The method of manufacturing a semiconductor device according to claim 17, wherein the step of forming the first resist film on said hard mask includes the steps of: forming a first antireflection film made of an organic material on said mask; and forming said first resist film on said first antireflection film, and
   wherein the step of etching said hard mask using said first resist film as a mask is a step of etching said first antireflection film and said hard mask using said first film as a mask.

24. The method of manufacturing a semiconductor device according to claim 23, wherein in step of processing said first resist film by trimming said first resist film, said first antireflection film is processed into the same pattern as said first resist film by trimming said first antireflection film.

25. The method of manufacturing a semiconductor device according to claim 17, wherein the step of forming the second resist film on said whole surface includes the steps of:
   forming a second antireflection film made of an organic material on the whole surface; and
   forming said second resist film on said second antireflection film, and
   wherein the step of etching said hard mask using said second resist film as a mask is a step of etching said second antireflection film and said hard mask using said second resist film as a mask.

26. The method of manufacturing a semiconductor device according to claim 25, wherein in the step of processing said second resist film by trimming said second resist film, said second antireflection film is processed into the same pattern as said second resist film by trimming said second antireflection film.

27. The method of manufacturing a semiconductor device according to claim 17, wherein in the step of processing said first resist film, a pattern of an alignment mark is formed on the first resist film and an exposure mask to be used for exposure of said second resist film is aligned with reference to said alignment mark.

28. The method of manufacturing a semiconductor device according to claim 27, wherein a pattern to eliminate said alignment mark is formed on the exposure mask to be used for exposure of said second resist film.

29. The method of manufacturing a semiconductor device according to claim 17, wherein said second region is a gate electrode of a transistor.

30. The method of manufacturing a semiconductor device according to claim 29, wherein said first region includes wiring to which said gate electrode is connected.

31. The method of manufacturing a semiconductor device according to claim 17, wherein said hard mask is made of an inorganic material.

32. The method of manufacturing a semiconductor device according to claim 17, further comprising a step of removing said hard mask after the step of etching said film to be processed.

* * * * *